United States Patent [19]
Chun

[11] Patent Number: 5,764,652
[45] Date of Patent: Jun. 9, 1998

[54] REPAIR CIRCUIT OF SEMICONDUCTOR MEMORY DEVICE

[75] Inventor: Jun Hyun Chun, Chungcheongbuk-do, Rep. of Korea

[73] Assignee: LG Semicon Co., Ltd., Chungcheongbuk-do, Rep. of Korea

[21] Appl. No.: 723,244

[22] Filed: Sep. 30, 1996

[30] Foreign Application Priority Data

Dec. 11, 1995 [KR] Rep. of Korea ............... 1995-48246

[51] Int. Cl.$^6$ ........................................... G06F 11/00
[52] U.S. Cl. ........................................ 371/10.3; 371/21.1
[58] Field of Search ............................... 371/10.3, 21.1; 365/200, 201

[56] References Cited

U.S. PATENT DOCUMENTS

| | | | |
|---|---|---|---|
| 4,389,715 | 6/1983 | Eaton, Jr. et al. | 365/200 |
| 4,799,177 | 1/1989 | Kodama et al. | 365/205 |
| 4,849,938 | 7/1989 | Furutani et al. | 371/10 |
| 4,858,192 | 8/1989 | Tatsumi et al. | 365/200 |
| 5,197,030 | 3/1993 | Akaogi et al. | 365/200 |
| 5,260,907 | 11/1993 | Kim | 365/201 |
| 5,381,370 | 1/1995 | Lacey et al. | 365/200 |
| 5,392,247 | 2/1995 | Fujita | 365/200 |

*Primary Examiner*—Phung M. Chung
*Attorney, Agent, or Firm*—Finnegan, Henderson, Farabow, Garrett & Dunner, L.L.P.

[57] ABSTRACT

A repair circuit of a semiconductor memory device is disclosed, including an address input unit for receiving and processing external addresses; a repair detecting unit for detecting whether there are addresses repaired on a programmed data basis; a normal decoding unit for selecting normal word lines; a redundant decoding unit for selecting redundant word lines; a repair address determining unit, enabled by a signal produced from the repair detecting unit, for comparing the external addresses with repair addresses programmed therein; a normal decoder control unit for controlling a turned-on or turned-off state of the normal decoding unit by receiving the external addresses, the signal produced from the repair detecting unit, and a repair signal produced from the repair address determining unit; an address delay unit for controlling delays of the external addresses, based on the output signals of the repair detecting unit; and a sense amplifier control unit driven by an output signal from the address delay unit.

6 Claims, 8 Drawing Sheets

REPAIR CIRCUIT OF SEMICONDUCTOR MEMORY DEVICE

BACKGROUND OF THE INVENTION

1. Field of the Invention

The present invention relates to a repair circuit of a semiconductor memory device. More particularly, the present invention relates to a repair circuit of a semiconductor memory device in which the access path of a normal chip differs from that of a repaired chip, whereby unnecessary access delay is removed in a normal chip to ensure high speed access of data in such a chip.

2. Description of the Prior Art

Figure 1:
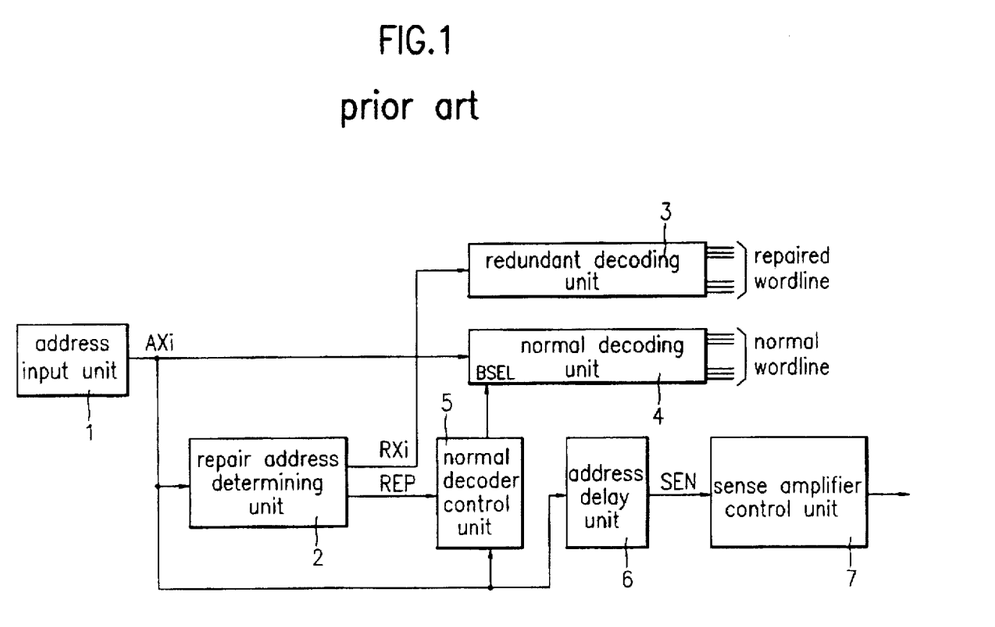
FIG. 1 is a schematic block diagram of a conventional repair circuit of a semiconductor memory device.
Figure 2A:
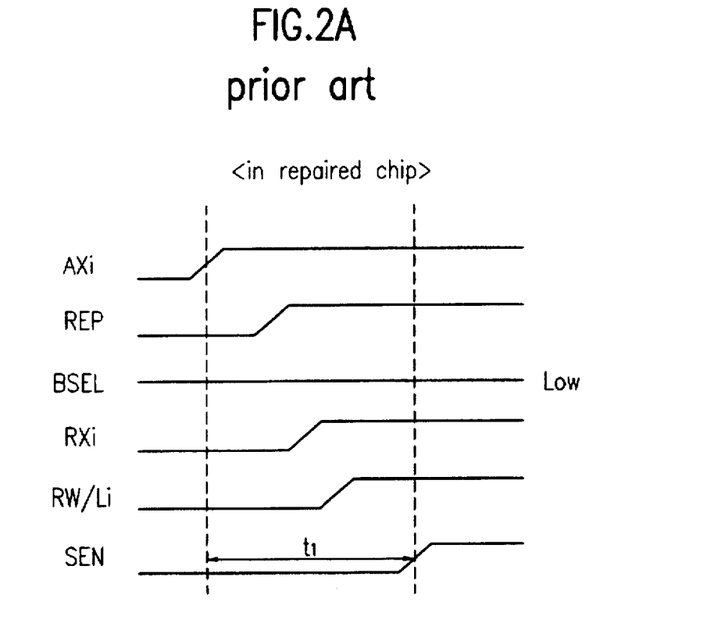
FIGS. 2A and 2B are timing diagrams of signals produced from each main unit of the conventional repair circuit of a semiconductor memory device shown in FIG. 1.
Figure 2B:
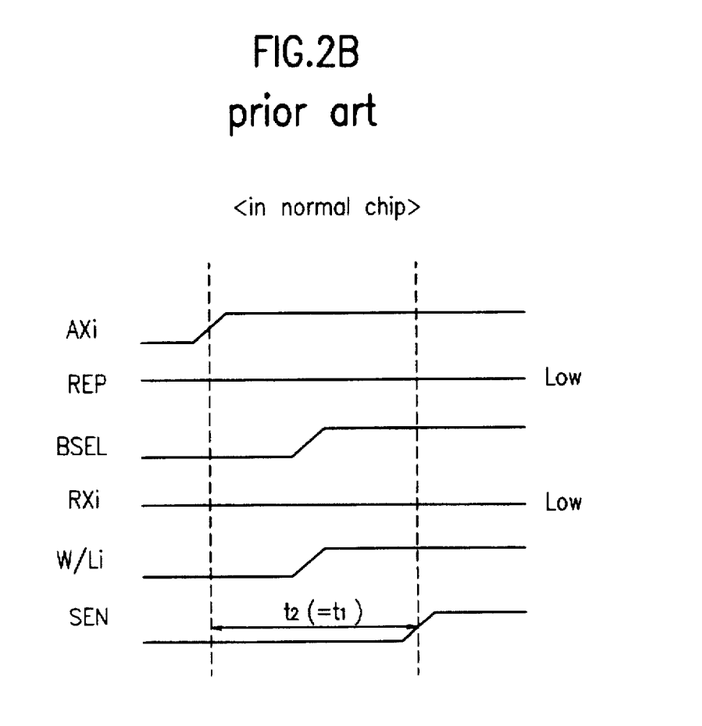
Figure 3A:
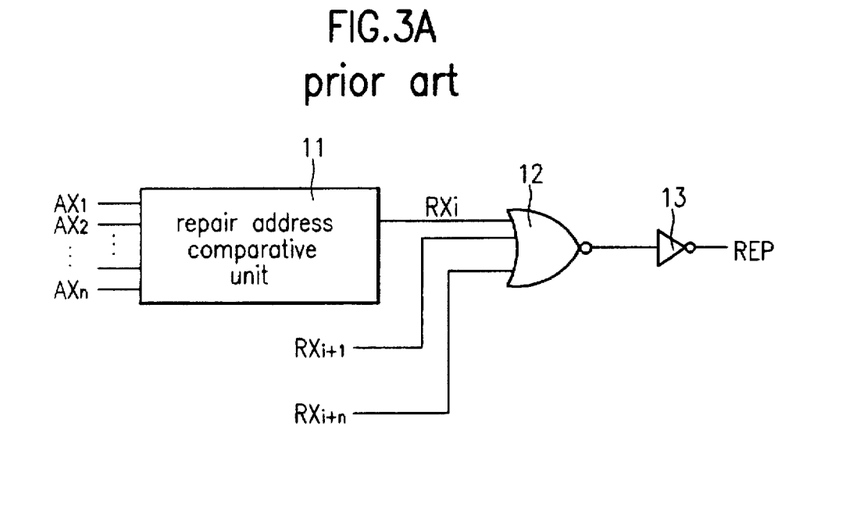
FIGS. 3A to 3C are detailed views of each main unit of the conventional repair circuit of a semiconductor memory device shown in FIG. 1.
Figure 3B:
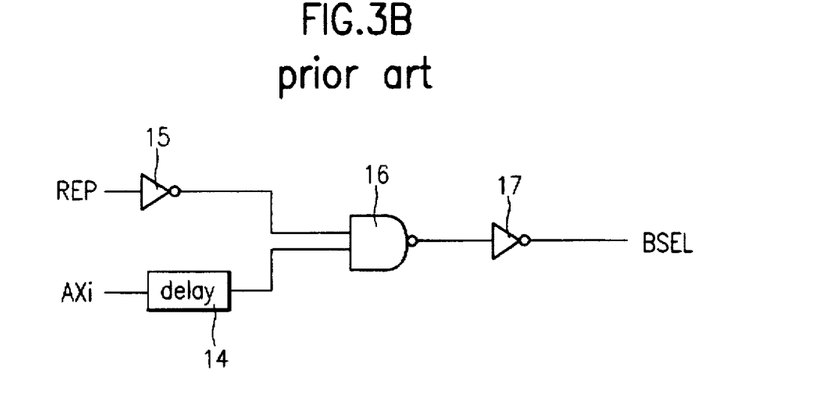
Figure 3C:
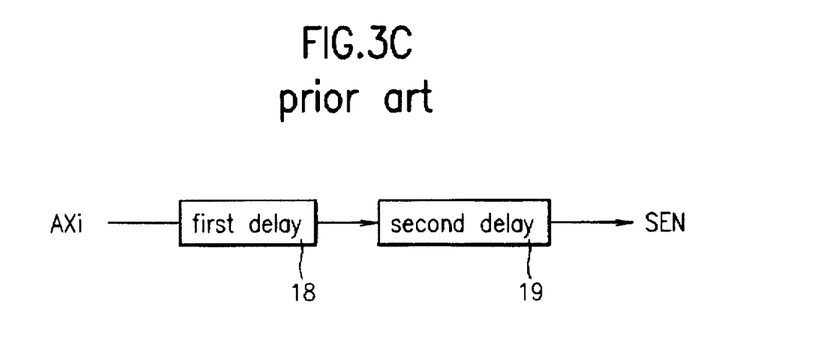

FIG. 1 is a schematic block diagram of a conventional repair circuit of a semiconductor memory device, and FIGS. 2A and 2B are timing diagrams of signals produced from each main unit of the repair circuit shown in FIG. 1. FIGS. 3A to 3C are detailed views of each main unit of the conventional repair circuit shown in FIG. 1.

Referring to FIG. 1, the repair circuit of a semiconductor memory device includes an address input unit 1 for receiving external row addresses, a repair address determining unit 2 for comparing and determining address signals produced from the address input unit 1 with repair address signals that are stored in advance, and a redundant decoding unit 3 for selecting word lines repaired in response to determining signals from the repair address determining unit 2. The repair circuit also includes a normal decoding unit 4 for selecting normal word lines, a normal decoder control unit 5 for determining a turned-on or a turned-off state (an enable or disable state) of the normal decoding unit 4 upon receipt of a control signal from the repair address determining unit 2, an address delay unit 6 for delaying the address signals from the address input unit 1 to sense the address signals after the word lines are accessed, and a sense amplifier control unit 7 for controlling the driving of a sense amplifier upon receipt of the address signals delayed by the address delay unit 6.

As shown in FIG. 3A, the repair address determining unit 2 includes a repair address comparative unit 11 for comparing n-bit addresses $AX_1$ to $AX_n$ (hereinafter, AXi) with repair addresses, a NOR gate 12 for outputting a logical product of the outputs of the repair address comparative unit 11, and an inverter 13 connected to the NOR gate 12 for outputting signal REP.

The normal decoding control unit 5, as shown in FIG. 3B, has a NAND gate 16 for outputting the logical product of the address signals AXi which are delayed, for the period of time required for the addresses to pass the repair address determining unit 2, via a delay 14, and the repair signal REP of the repair address determining unit 2 inverted by an inverter 15. The normal decoding control unit 5 also includes an inverter 17 for inverting the output from the NAND gate 16 and for outputting a control signal BSEL for tuning on or tuning off the normal decoding unit 4.

Referring now to FIG. 3C, the address delay unit 6 comprises two delays 18 and 19. The address data AXi is sensed by a sense amplifier after it is delayed by delays 18 and 19 for a predetermined period of time necessary to access word lines.

The operation of the conventional repair circuit of a semiconductor memory device is described as follows with reference to FIGS. 1 to 3C.

When n-bit row addresses are input to the address input unit 1, the addresses are processed therein to produce address signals AXi, as shown in FIGS. 2A and 2B. The address signals AXi are simultaneously input to the repair address determining unit 2, the normal decoder control unit 5, and the address delay unit 6.

When the address signals AXi are input to the address determining unit 2, the repair address comparative unit 11 compares the address signals AXi with the repair addresses that have been programmed therein to produce output signals RXi. The repair signal REP is generated via the NOR gate 12 and inverter 13.

When it comes to a repaired chip, the output signals RXi attain a high level to access the word lines repaired via the redundant decoding unit 3, as shown in FIG. 2A. The repair signal REP also attains a high level and is input to the normal decoder control unit 5, and passes the inverter 15 of the normal decoder control unit 5. The NAND gate 16 outputs the logical product of the repair signal REP and the address signals AXi, inputted via the delay 14. The inverter 17 produces a low-level signal BSEL to turn off the normal decoding unit 4. The address signals AXi are delayed by the delays 18 and 19 of the address delay unit 6, and are then input to the sense amplifier control unit 7 so that the address signals will be sensed by the sense amplifier after the repaired word lines are accessed.

When it comes to a normal chip, the output signals RXi of the repair address comparative unit 11 attain a low level to turn off the redundant decoding unit 3, as shown in FIG. 2B. The repair signal REP is at a low level as well. The repair signal REP is input to the normal decoder control unit 5. The NAND gate 16 outputs the logical product of the repair signal REP and the address signals AXi delayed by the delay 14 for the predetermined period of time required for processing in the repair address determining unit 2. A high-level signal BSEL is produced thereby turning on the normal decoding unit 4. The address signals AXi are delayed in the address delay unit 6 for the same period of time as that of the repaired chip, and are input to the sense amplifier control unit 7, so that the accessed normal word lines are sensed.

According to the conventional technique, even in a normal chip, the output signal of the normal decoder control unit 5 turns on the normal decoding unit 4 after a delay of a predetermined period of time required for the address signals to be processed in the repair address determining unit 2. Both a normal chip and a repaired chip have the same delay from receiving the address signals AXi to turning on the sense amplifier because the sense amplifier is enabled after the address signals have been delayed for the same period of time by the address delay unit 6. Thus, a normal chip has an unnecessary delay and the attendant disadvantages of increased access time and increased power consumption due to the unnecessary operation of the repair address determining unit.

SUMMARY OF THE INVENTION

The present invention is intended to overcome the above-described disadvantages of conventional repair circuits of semiconductor memory devices.

It is an object of the present invention to provide a repair circuit of a semiconductor memory device in which the access path of a normal chip differs from that of a repaired chip and whereby unnecessary signal delay is eliminated thereby ensuring high speed access of data in a normal chip.

The repair circuit of a semiconductor memory device of the present invention includes an address input unit for receiving and processing external addresses, a repair detecting unit for detecting whether there are addresses repaired on a programmed data basis, a normal decoding unit for selecting normal word lines, a redundant decoding unit for selecting redundant word lines, a repair address determining unit enabled by a signal produced from the repair detecting unit to compare the addresses input to the address input unit with repair addresses programmed therein, a normal decoder control unit for controlling a turned-on or turned-off state of the normal decoding unit by receiving the address signals, the signal produced from the repair detecting unit, and a repair signal produced from the repair address determining unit, an address delay unit for controlling the delay of the addresses input as output signals of the repair detecting unit, and a sense amplifier control unit driven by the output signal from the address delay unit.

As another aspect of the present invention, a repair circuit of a semiconductor memory device includes an address input unit for receiving and processing external addresses, a repair detecting unit for detecting whether there are addresses repaired on a programmed data basis, a redundant decoding unit for selecting redundant column lines, a normal decoding unit for selecting normal column lines, a repair address determining unit enabled by an output signal from the repair detecting unit to compare the addresses input to the address input unit with repair addresses programmed therein, and a normal decoder control unit for controlling a turned-on or a turned-off state of the normal decoding unit and repair decoding unit by receiving the address signals, the signal produced from the repair detecting unit, and a repair signal produced from the repair address determining unit.

BRIEF DESCRIPTION OF THE DRAWINGS

The above object and other advantages of the present invention will become more apparent by describing in detail the preferred embodiments of the present invention with reference to the attached drawings in which.

DESCRIPTION OF THE PREFERRED EMBODIMENTS

A repair circuit of a semiconductor memory device of the present invention will be described in detail with reference to the accompanying drawings.

Figure 4:
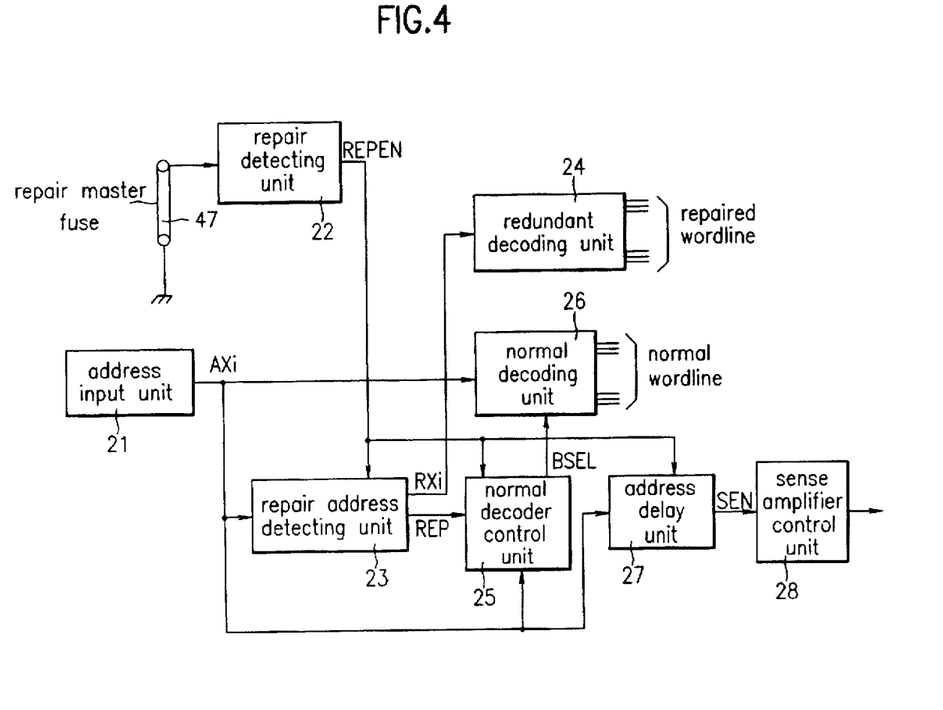
FIG. 4 is a schematic block diagram of a repair circuit of a semiconductor memory device in accordance with a first preferred embodiment of the present invention.
Figure 5A:
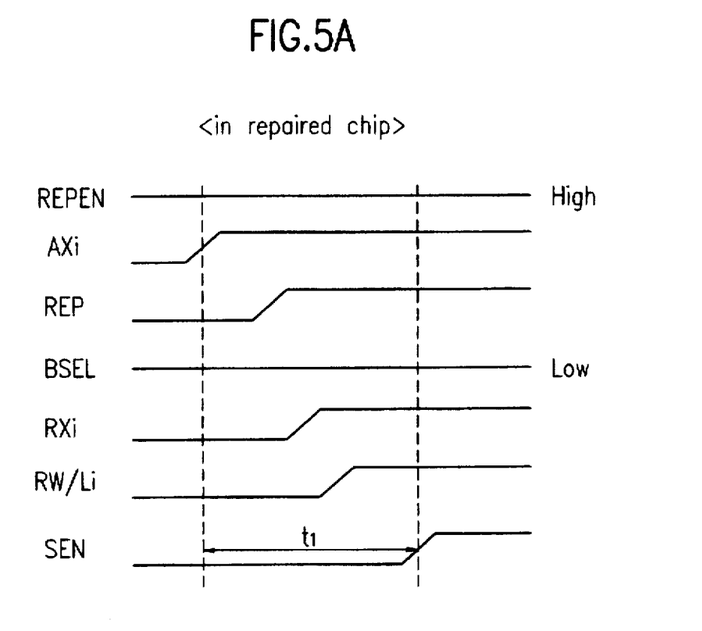
FIGS. 5A and 5B are timing diagrams of signals produced from each main unit of the repair circuit of a semiconductor memory device shown in FIG. 4.
Figure 5B:
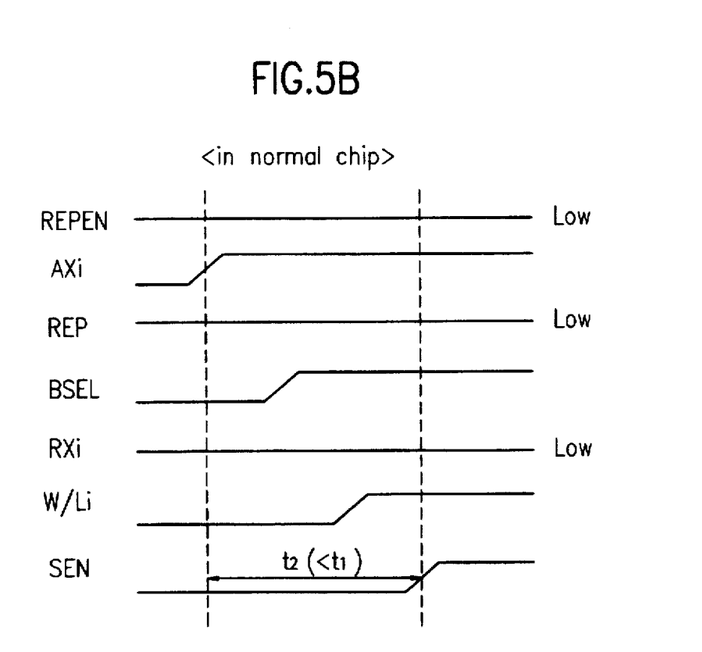

FIG. 4 is a schematic block diagram of a repair circuit of a semiconductor memory device in accordance with a first preferred embodiment of the present invention. FIGS. 5A and 5B are timing diagrams of signals produced from each main unit of the repair circuit of a semiconductor memory device shown in FIG. 4, and FIGS. 6A to 6D are detailed views of each main unit of the repair circuit of a semiconductor memory device shown in FIG. 4.

Referring to FIG. 4, the repair circuit of a semiconductor memory device of the present invention includes an address input unit 21 for receiving and processing external addresses, a repair detecting unit 22 for detecting whether there are addresses that are repaired by data programmed in the unit, and a redundant decoding unit 24 for selecting redundant word lines. The repair circuit also includes a normal decoding unit 26 for selecting normal word lines, a repair address determining unit 23, enabled by an output signal from the repair detecting unit 22, which compares and determines the addresses input from the address input unit 21 to the repair addresses programmed in the unit. A normal decoder control unit 25 controls the turned-on or turned-off state of the normal decoding unit 26 by receiving the addresses AXi input through the address input unit 21, the signal REPEN produced from the repair detecting unit 22, and a repair signal REP output from the repair address determining unit 23. In addition, the repair circuit includes an address delay unit 27 for controlling the time delay of the input addresses by the signal REPEN produced from the repair detecting unit 22. A sense amplifier control unit 28 is driven by the output from the address delay unit 27.

Figure 6A:
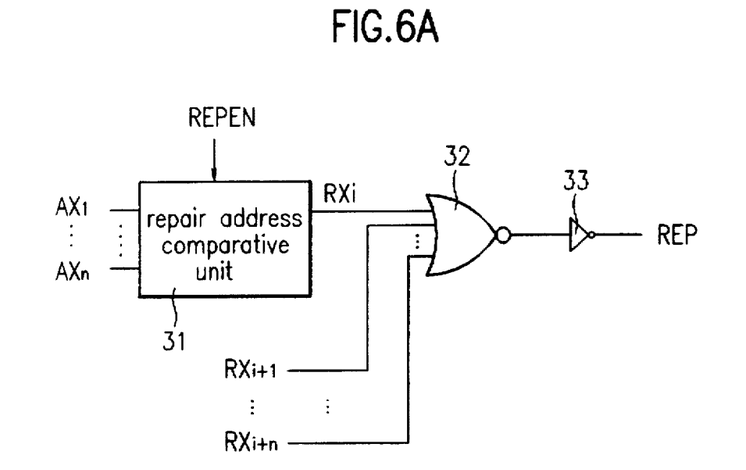
FIGS. 6A to 6D are detailed views of each main unit of the repair circuit of a semiconductor memory device shown in FIG. 4.

The repair address determining unit 23, as shown in FIG. 6A, has a repair address comparative unit 31 which is enabled by the repair detecting signal REPEN from the repair detecting unit 22. The repair address comparative unit 31 compares the n-bit addresses AXi to the repair addresses programmed in the unit. A NOR gate 32 outputs the logical product of the output signals RXi from the repair address comparative unit 31 and the other plural output signals $RXi_{+1}$ to $RXi_{+n}$. An inverter 33 inverts the output from the NOR gate 32 to produce a repair signal REP.

Figure 7:
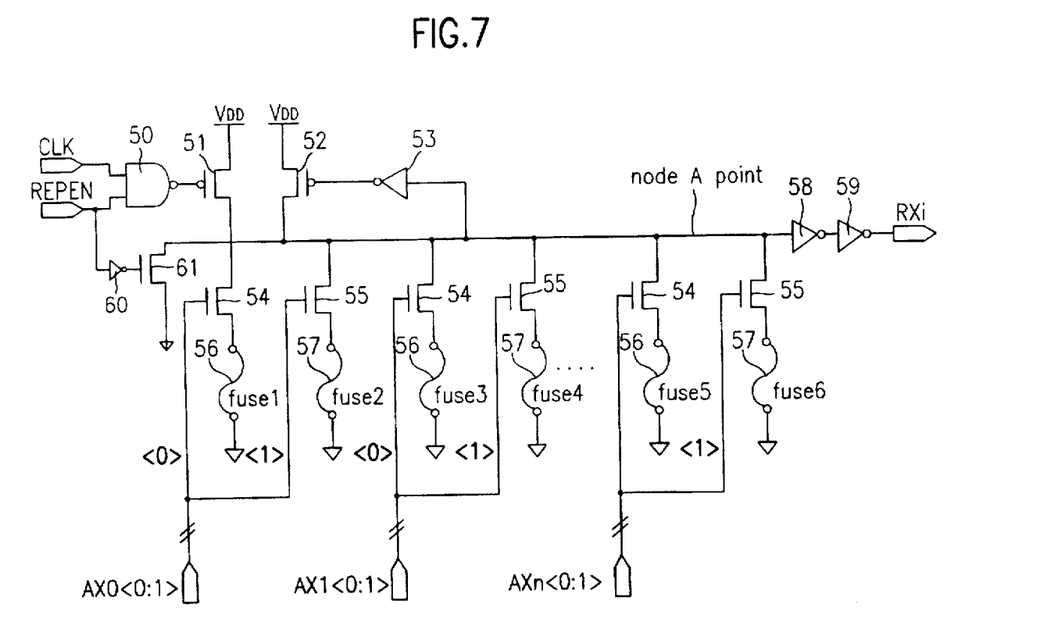
FIG. 7 is a detailed view of the repair address comparative unit shown in FIG. 6A.

The repair address comparative unit 31 is shown in greater detail in FIG. 7. A gate of a PMOS transistor 51 is connected to a NAND gate 50 which outputs the logical product of the repair detecting signal REPEN from the repair detecting unit 22 and a clock signal CLK. The PMOS transistor 51 has one side to which power VDD is applied and the other side connected to n couples of NMOS transistors 54 and 55. Each pair of NMOS transistors 54 and 55 is connected to a pair of fuses 56 and 57, and n-bit address signals AXi are respectively applied to the gates of NMOS transistor pairs 54 and 55.

The PMOS transistor 51 is connected to a latch circuit comprising a PMOS transistor 52 and an inverter 53, connected in parallel. Signals RXi are produced via two inverters 58 and 59. The PMOS transistors 51 and 52, NMOS transistors 54 and 55, the NAND gate 50, an inverter 60, and an NMOS transistor 61 are connected with each other to prevent node A from floating. Each pair of fuses 56 and 57 is designed to be programmed by cutting to detect the repair address. The precharged state of node A can be maintained when the input addresses correspond to the programmed data of each pair of fuses 56 and 57. When this is not the case, the precharge is removed from node A via the NMOS transistors driven by the input of the addresses and the uncut fuses, whereby the precharged state of the node A is checked to detect the repair addresses.

Figure 6B:
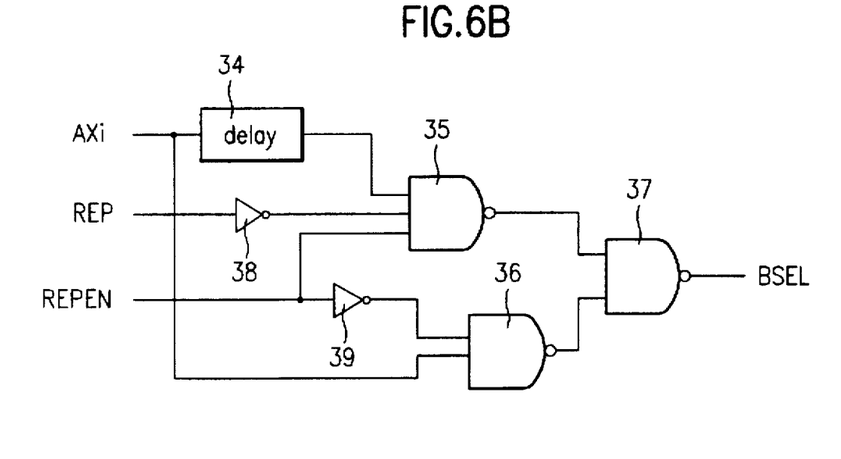

Referring now to FIG. 6B, the normal decoder control unit 25 has a NAND gate 35 for outputting the logical product of the address signals AXi, which are delayed by the delay 34, the repair signal REP, which is inverted by an inverter 38, and the repair detecting signal REPEN output from the repair detecting unit 22. A NAND gate 36 outputs the logical product of the address signals AXi and the repair detecting signal REPEN, which is inverted by an inverter 39. A NAND gate 37 outputs the logical product of output signals from the NAND gates 35 and 36.

Figure 6C:
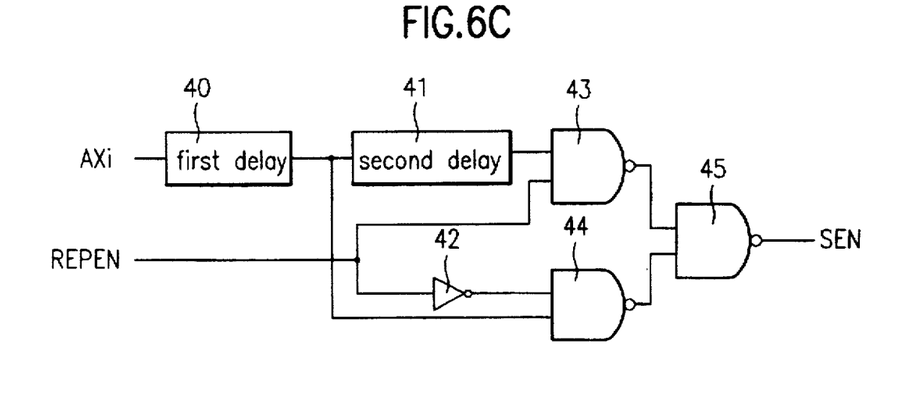

The address delay unit 27, as shown in FIG. 6C, includes a NAND gate 43 for outputting the logical product of the address signals AXi, input through delays 40 and 41, and the repair detecting signal REPEN. A NAND gate 44 outputs the logical product of the address signals AXi, delayed by the delay 40, and the repair detecting signal REPEN, inverted by an inverter 42. A NAND gate 45 outputs the logical product of an output of the NAND gates 43 and 44.

Figure 6D:
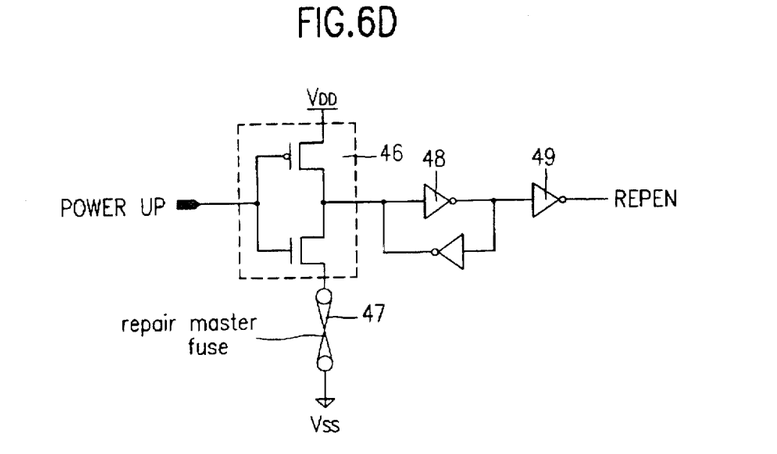

FIG. 6D depicts the repair detecting unit 22 which includes CMOS transistors 46 having one side connected to a repair master fuse 47 for determining if a chip is a repaired one. A latch circuit 48 latches an output from the CMOS transistors 46. An inverter 49 inverts the output from the latch circuit 48. The repair detecting unit also includes a power-up circuit (not shown) commonly connected to the two gates of the CMOS transistors 46.

The operation of the repair circuit in accordance with the first preferred embodiment of the present invention will be described referring to FIGS. 5A and 5B which are timing diagrams of the signals produced from each main unit shown in FIGS. 6A to 6C.

The n-bit row addresses are processed in the row address input unit 21 to produce address signals AXi. These address signals AXi are simultaneously input to the repair address determining unit 23, the normal decoding unit 26, and the address delay unit 27. As shown in FIG. 6D, the repair detecting unit 22 receives a POWER-UP signal for detecting the power-up state of a chip and for detecting the programmed condition of the repair master fuse 47 at the time of powering up the chip. The repair detecting unit 22 produces a high-level signal when the fuse 47 is programmed to be cut, otherwise a low-level signal is produced.

Accordingly, when it comes to a repaired chip, the precharged state of the repair detecting unit 22, kept by the latch circuit 48, is maintained to produce a high-level repair detecting signal REPEN, and this high-level repair detecting signal REPEN is simultaneously input to the repair address determining unit 23, the normal decoder control unit 25, and the address delay unit 27.

When the repair address determining unit 23 receives the high-level repair detecting signal REPEN, as shown in FIG. 7, the NAND gate 50 outputs the logical product of the clock signal CLK and the repair detecting signal REPEN to produce a clock signal CLK that is inverted. When the inverted clock signal CLK is at a low level, the PMOS transistor 51 is turned on, and node A is precharged. The precharged state of the node A is maintained by the latch circuits 52 and 53.

Thus, when the programmed data (fuse cutting combination) of the fuses corresponds with the input addresses, the precharged state of node A is maintained intact, and the output signals RXi attain a high level, so that the repair signal REP will also attain a high level. Simultaneously, the redundant word lines will be selected.

On the contrary, when the programmed data of the fuses does not correspond to the input addresses in a normal chip, the application of the addresses turns on at least one of the n-couple of NMOS transistors 54 and 55 to which uncut fuses are connected, and the high-level state of the node A changes to a low level state. The respective output signals RXi and repair signal REP also attain a low level. Even if the repair detecting signal REPEN attains a high level, the fuse cutting combination can correspond to the input addresses as in the case of the repair addresses, whereby the output signals RXi and the repair signal REP attain a high level.

When the high-level repair detecting signal REPEN and the high-level repair signal REP are input to the normal decoder control unit 25, the repair detecting signal REPEN is inverted into a low-level signal by the inverter 39 and is input to the NAND gate 36. Thus, the output of the NAND gate 36 attains a high level without regard to the address signals AXi input to another input terminal, and the NAND gate 35 outputs the logical product of the high-level repair detecting signal REPEN, the low-level repair signal REP, inverted by the inverter 38 and the address signals AXi, delayed by the delay 34. The output signal of the NAND gate 37 then attains a low level, and the normal decoding unit 26 is turned off.

When the high-level repair detecting signal REPEN is input to the address delay unit 27, the high-level signal is applied to one input terminal of the NAND gate 43, and the signal is inverted into a low-level signal by the inverter 42. The output of inverter 42 is applied to one input terminal of the NAND gate 44. Thus, the output signal of the NAND gate 44 maintains a high level, regardless of the address signals AXi input through the first delay 40, and the NAND gate 43 outputs the logical product of the address signals AXi, input through the delays 40 and 41, and the repair detecting signal REPEN to produce a signal that inverts the address signals AXi. The NAND gate 45 outputs to the sense amplifier control unit 28 a high-level output signal at a section where the output signal of the NAND gate 45 attains a low level, thereby performing a sensing operation.

In a normal chip, since the repair master fuse 47 of the repair detecting unit 22 is not being cut, a high-level signal is applied to the gates of the CMOS transistors 46 to turn on only the NMOS transistor 61, and the electric charge of the CMOS transistors 46 is released through the repair master fuse 47 so that the output of the CMOS transistors 46 is latched to a high level and the repair detecting signal REPEN produced via the latch circuit 48 and the inverter 49 will attain a low level. Referring now to FIG. 7, the low-level repair detecting signal REPEN that is input to the repair address determining unit 23, is sent to the NAND gate 50. Since the output of the NAND gate 50 is at a high level, without regard to the clock signal CLK, the PMOS transistor 51 is turned off. Node A, is prevented from floating and attains a low level through the NMOS transistor 61, which is turned on.

Accordingly, even if the level of clock signal CLK changes, the signals RXi attain a low level because node A is not precharged so that electric current required for charging node A will be saved. Additionally, the signals RXi are at a low level, and the repair signal REP attains a low level.

As shown in FIG. 6B, the low-level repair detecting signal REPEN, which is input to the normal decoder control unit 27, is inverted to a high level via the inverter 39 and is input to one input terminal of the NAND gate 36. The NAND gate 36 outputs the logical product of the inverted repair detecting signal REPEN and the address signals AXi, without a delay to produce a low-level signal at a high-level section of the address signals AXi.

The NAND gate 37 produces a high-level signal regardless of the output signal from the NAND gate 35, which state is subject to the level of the address signals AXi, delayed by the delay 34 for a predetermined period of time, thereby enabling the normal decoding unit 26 to select normal word lines. This ensures a fast access time of normal word lines in a normal chip.

As shown in FIG. 6C, in the address delay unit 27, the low-level repair detecting signal REPEN input thereto is inverted to a high-level signal via the inverter 42, and is then output to the NAND gate 44. The NAND gate 44 outputs the logical product of the inverted repair detecting signal REPEN and the address signals AXi, input via the delay 40, and produces a low-level signal at a high-level section of the address signals AXi.

The output signal from the NAND gate 45 attains a high level due to the low-level signal REPEN without regard to the state of the output signal produced from the NAND gate 43, which is determined by the address signals AXi, input through delays 40 and 41. The sense amplifier control unit 28 performs the sensing operation on the high-level signal SEN output from the NAND gate 45.

The unnecessary access delay is removed in a normal chip to make shorter the period of time, t2, shown in FIG. 5B which is required to start sensing in a normal chip, as compared with the time, t1, shown in FIG. 5A to start sensing in a repaired chip. This results in high speed access of data in a normal chip and the reduction of power consumption.

Figure 8:
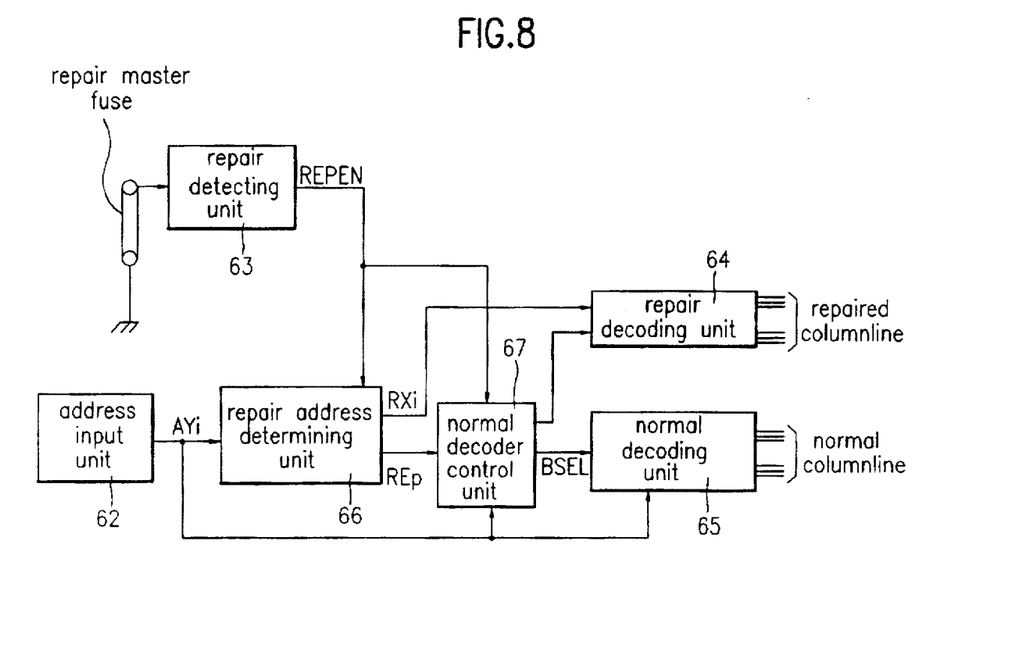
FIG. 8 is a schematic block diagram of a repair circuit of a semiconductor memory device in accordance with a second preferred embodiment of the present invention.

FIG. 8 is a schematic block diagram of a repair circuit of a semiconductor memory device for accessing column lines in accordance with a second preferred embodiment of the present invention.

The repair circuit of the second preferred embodiment includes an address input unit 62 for receiving and processing external addresses, a repair detecting unit 63 for detecting whether there are addresses repaired on a programmed data basis, and a redundant decoding unit 64 for selecting redundant column lines. The repair circuit also includes a normal decoding unit 65 for selecting normal column lines, a repair address determining unit 66, enabled by an output signal REPEN from the repair detecting unit 64, which compares the addresses input to the address input unit 62 with repair addresses programmed therein, and a normal decoder control unit 67 for controlling a turned-on or a turned-off state of the normal decoding unit 65, and a repair decoding unit 64. By receiving the addresses AYi, the signal REPEN is produced from the repair detecting unit 63 and a repair signal REP is produced from the repair address determining unit 66.

The repair circuit of the second preferred embodiment may be utilized for accessing column lines, and does not include sensing means, such as an address delay unit or a sense amplifier control unit, and thereby differs from the first preferred embodiment of the present invention. The other components are the same as those of the first embodiment in function, and a detailed description of each component will be deleted.

As mentioned above, the repair circuit of the present invention allows the access path of a normal chip to differ from that of a repaired chip, and prevents unnecessary access delay in a repair address determining unit of a normal chip to thereby ensure high speed access of data in a normal chip and lower power consumption.

While this invention has been described in connection with what is presently considered to be the most practical and preferred embodiments, it is to be understood that the invention is not limited to the disclosed embodiments, but, on the contrary, is intended to cover various modifications and equivalent arrangements included within the spirit and scope of the appended claims.

What is claimed is:

1. A repair circuit of a semiconductor memory device comprising:

address input means for receiving and processing external addresses;

repair detecting means for detecting whether there are addresses repaired on a programmed data basis and for outputting a first signal;

normal decoding means for selecting normal word lines by decoding the external addresses;

repair address determining means, for storing repair addresses enabled by a signal produced from the repair detecting means, for comparing the external addresses with the repair addresses, and for outputting a repair signal and output signals;

redundant decoding means for selecting redundant word lines by decoding the output signals;

normal decoder control means for controlling a turned-on or a turned-off state of the normal decoding means by receiving the external addresses, the first signal, and the repair signal;

address delay means for controlling a delay of the external addresses based on the first signal from the repair detecting means and for outputting an output signal; and sense amplifier control means driven by the output signal from said address delay means.

2. A repair circuit of a semiconductor memory device as set forth in claim 1, wherein said repair detecting means includes:

a plurality of CMOS transistors, each with one side connected to a repair master fuse, for determining if a chip is a repaired one;

latching means for latching an output of the plurality of CMOS transistors; and first inverting means for inverting an output of the latching means; and wherein said plurality of CMOS transistors each have a gate commonly connected to an output of a power-up circuit.

3. A repair circuit of a semiconductor memory device as set forth in claim 1, wherein said repair address detecting means includes:

repair address comparative means, enabled by the first signal produced from the repair detecting means, for comparing n-bit addresses input thereto with repair addresses programmed therein;

a NOR gate for outputting a logical product of signals produced from the repair address comparative means and the other plural signals produced by the repair address comparative means; and second inverting means for inverting a signal produced by the NOR gate.

4. A repair circuit of a semiconductor memory device as set forth in claim 1, wherein the repair address determining means further includes:

a first NAND gate for outputting a logical product of the external addresses, delayed by a first delay, the repair signal of the repair address determining means, inverted by third inverting means, and the signal produced from the repair detecting means;

a second NAND gate for outputting a logical product of the external addresses and the signal of the repair detecting means, inverted by fourth inverting means; and a third NAND gate for outputting a logical product of signals produced from said first and second NAND gates.

5. A repair circuit of a semiconductor memory device as set forth in claim 1, wherein said address delay means includes:

a fourth NAND gate for outputting a logical product of the external addresses, input through second and third delays, and the signal produced from the repair detecting means;

a fifth NAND gate for outputting a logical product of the external addresses, input through the second delay, and the signal produced from the repair detecting means, inverted by fifth inverting means; and a sixth NAND gate for outputting a logical product of signals produced from said fourth and fifth NAND gates.

6. A repair circuit of a semiconductor memory device comprising:

address input means for receiving and processing external addresses;

repair detecting means for detecting whether there are addresses repaired on a programmed data basis;

normal decoding means for selecting normal word lines by decoding signals produced from the address input means;

repair address determining means, enabled by an output signal from the repair detecting means, for comparing the external addresses with the repair addresses programmed therein; and redundant decoding means for selecting redundant word lines by decoding signals produced from the repair address determining means;

normal decoder control means for controlling a turned-on or a turned-off state of the normal decoding means by receiving the external addresses, a signal produced from the repair detecting means, and a repair signal produced from the repair address determining means.

* * * * *